United States Patent
Zhou et al.

(10) Patent No.: US 11,107,543 B2
(45) Date of Patent: *Aug. 31, 2021

(54) ADJUSTMENT OF READ AND WRITE VOLTAGES USING A SPACE BETWEEN THRESHOLD VOLTAGE DISTRIBUTIONS

(71) Applicant: Micron Technology, Inc., Boise, ID (US)

(72) Inventors: Zhenming Zhou, San Jose, CA (US); Murong Lang, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/035,501

(22) Filed: Sep. 28, 2020

(65) Prior Publication Data
US 2021/0065824 A1  Mar. 4, 2021

Related U.S. Application Data

(63) Continuation of application No. 16/553,942, filed on Aug. 28, 2019, now Pat. No. 10,790,036.

(51) Int. Cl.
| | | |
|---|---|---|
| *G11C 7/00* | (2006.01) |
| *G11C 16/34* | (2006.01) |
| *G11C 16/26* | (2006.01) |
| *G11C 16/14* | (2006.01) |
| *G11C 16/30* | (2006.01) |
| *G11C 16/10* | (2006.01) |
| *G11C 13/00* | (2006.01) |
| *G11C 29/50* | (2006.01) |

(52) U.S. Cl.
CPC .......... *G11C 16/349* (2013.01); *G11C 13/004* (2013.01); *G11C 13/0035* (2013.01); *G11C 13/0038* (2013.01); *G11C 13/0069* (2013.01); *G11C 13/0097* (2013.01); *G11C 16/10* (2013.01); *G11C 16/14* (2013.01); *G11C 16/26* (2013.01); *G11C 16/30* (2013.01); *G11C 29/50004* (2013.01); *G11C 2013/005* (2013.01); *G11C 2013/009* (2013.01); *G11C 2029/5004* (2013.01)

(58) Field of Classification Search
CPC ....... G11C 28/50; G11C 11/401; G11C 29/02; G11C 29/34
USPC ...................................................... 365/201
See application file for complete search history.

(56) References Cited

U.S. PATENT DOCUMENTS

| | | |
|---|---|---|
| 5,532,962 A | 7/1996 | Auclair et al. |
| 10,032,508 B1 | 7/2018 | Chu |
| 10,790,036 B1 * | 9/2020 | Zhou ...................... G11C 16/10 |

* cited by examiner

*Primary Examiner* — Son T Dinh
(74) *Attorney, Agent, or Firm* — Lowenstein Sandler LLP (57) ABSTRACT

A current demarcation voltage is determined, where the current demarcation voltage is to be applied to a memory cell for reading a state of the memory cell. Based on the current demarcation voltage and a space between a first threshold voltage distribution corresponding to a first state of the memory cell and a second threshold voltage distribution corresponding to a second state of the memory cell, a test demarcation voltage having a low error rate of reading the state of the memory cell is selected. The current demarcation voltage is set to correspond to the selected test demarcation voltage.

20 Claims, 7 Drawing Sheets

ADJUSTMENT OF READ AND WRITE VOLTAGES USING A SPACE BETWEEN THRESHOLD VOLTAGE DISTRIBUTIONS

RELATED APPLICATIONS

This application is a continuation application of copending U.S. patent application Ser. No. 16/553,942, filed Aug. 28, 2019, which is herein incorporated by reference.

TECHNICAL FIELD

Embodiments of the disclosure relate generally to memory sub-systems, and more specifically, relate to adjustment of read and write voltages using a space between threshold voltage distributions.

BACKGROUND

A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to adjustment of read and write voltages using a space between threshold voltage distributions. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can provide data to be stored at the memory sub-system and can request data to be retrieved from the memory sub-system.

The memory components can include non-volatile memory devices that store data from the host system. A non-volatile memory device is a package of one or more dice. The dice in the packages can be assigned to one or more channels for communicating with a memory sub-system controller. The non-volatile memory devices include cells (i.e., electronic circuits that store information), that are grouped into pages to store bits of data. The non-volatile memory devices can include three-dimensional cross-point ("3D cross-point") memory devices that are a cross-point array of non-volatile memory that can perform bit storage based on a change of bulk resistance, in conjunction with a stackable cross-gridded data access array. Another example of a non-volatile memory device is a negative-and (NAND) memory device. Other examples of non-volatile memory devices are described below in conjunction with FIG. 1.

Each of the memory devices can include one or more arrays of memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values. For example, a single level cell (SLC) can store one bit of information and has two logic states. The various logic states have corresponding threshold voltage levels. A threshold voltage (VT) is the voltage applied to the cell circuitry (e.g., control gate at which a transistor becomes conductive) to set the state of the cell. A cell is set to one of its logic states based on the VT that is applied to the cell. For example, if a high VT is applied to an SLC, a charge will be present in the cell, setting the SLC to store a logic 0. If a low VT is applied to the SLC, charge will be absent in the cell, setting the SLC to store a logic 1.

A threshold voltage (VT) is hereinafter referred to as "demarcation voltage". The demarcation voltage can be a particular voltage that is applied to memory cells of a memory component to read the data stored at the memory cells. For example, if a threshold voltage of a particular memory cell is identified as being below the demarcation voltage that is applied to the particular memory cell, then the data stored at the particular memory cell can be read as a particular value (e.g., a logical '1') or determined to be in a particular state (e.g., a set state). If the threshold voltage of the particular memory cell is identified as being above the demarcation voltage, then the data stored at the particular memory cell can be read as another value (e.g., a logical '0') or determined to be in another state (e.g., a reset state). Thus, the demarcation voltage can be applied to memory cells to determine values stored at the memory cells. Such threshold voltage can be within a range of threshold voltages or a normal distribution of threshold voltages.

The threshold voltage or the threshold voltage distribution of a memory cell in a memory sub-system can shift or change over time. When the threshold voltage of a memory cell changes, the application of the demarcation voltage can be inaccurate relative to the changed threshold voltage. For example, when the demarcation voltage is applied to the memory cell, the data stored at the memory cell can be misread or misinterpreted to be at a wrong value as compared to the value as originally stored when the threshold voltage had not yet shifted.

A memory sub-system updates or resets the demarcation voltage and a write voltage (i.e., a voltage applied to write a value to a memory cell) after each time a threshold count of read or write operations has been performed. A conventional memory sub-system applies pre-determined values for setting the demarcation voltage and the write voltage. However, there are various factors that cause the threshold voltage or its distribution to shift or change. For example, at a given threshold count of read or write operations, the amount of shift or change in the threshold voltage distribution can be different based on operations conditions, such as a temperature and a write to write delay (i.e., a period of time between performance of consecutive write operations). Therefore, such a rigid conventional approach of updating the demarcation voltage and the write voltage may not accurately and fully account for the shift or change in the threshold voltage or its distribution.

Aspects of the present disclosure address the above and other deficiencies by having a memory sub-system that adjusts a read and write voltage based on a space between threshold voltage distributions. To adjust the read voltage (i.e., the demarcation voltage), the memory sub-system tests some voltages within a particular range to select one for replacing a current demarcation voltage. The particular range can be defined by the space between threshold distributions and also, the current demarcation voltage. The memory sub-system can select the voltage causing the lowest error rate of reading data from a memory cell for updating the current demarcation voltage. As for the write voltage (e.g., a write voltage for a reset state of the memory cell), the memory sub-system tests at least one voltage determined based on the current reset voltage for every threshold count of write operations. The memory sub-system can update the current reset voltage with the voltage associated with an error rate of reading data that satisfies a threshold condition specifying a maximum error rate.

Advantages of the present disclosure include, but are not limited to enhancing reliability of memory cells and preservation of data integrity. As a result, fewer error correction operations need to be performed. For example, since the demarcation voltage is adjusted by incorporating various factors that affect the threshold voltage, the retrieved data can be reliably read with fewer errors. Also, since the write voltage is adjusted for a reduced error rate, fewer errors will result in reading the written data from the memory cell. Moreover, the decreased error rate can result in decreased power consumption associated with error correction or recovery operations and can free system resources for other functionality.

Figure 1:
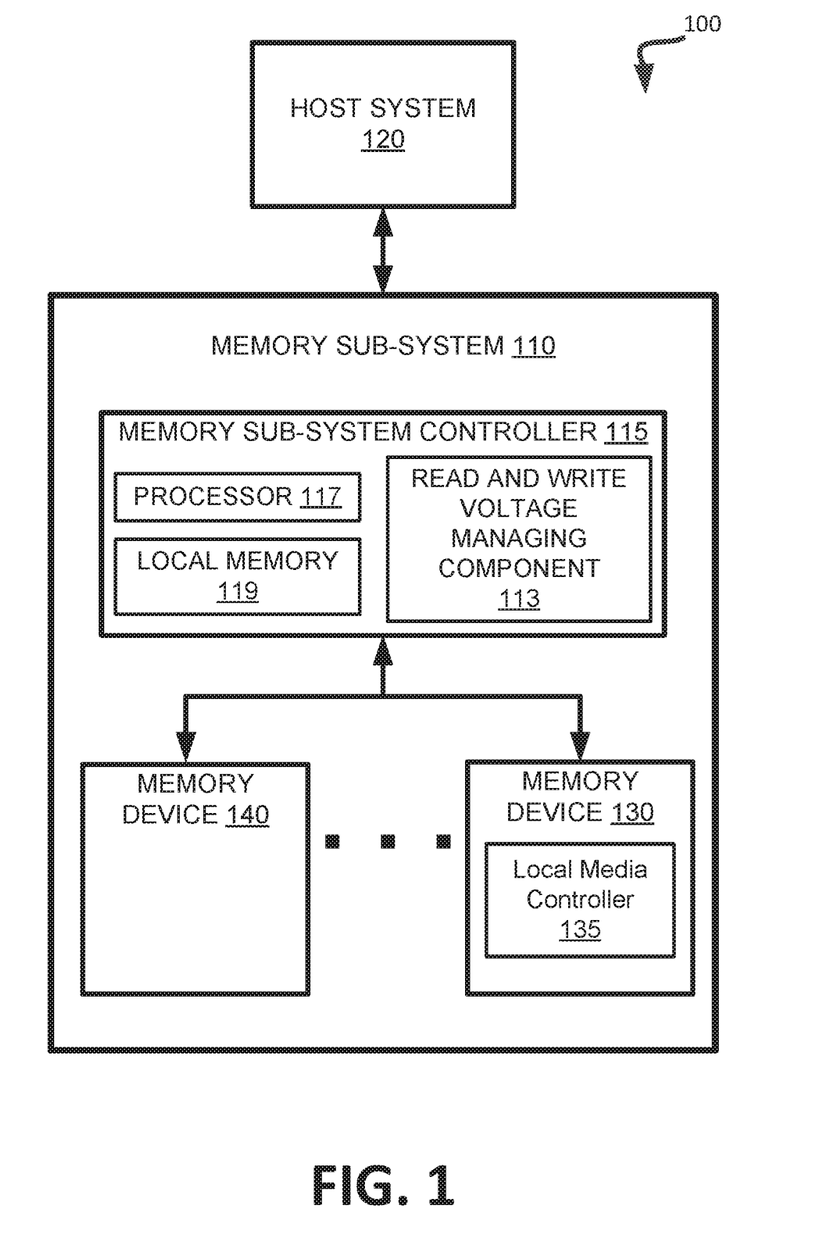
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, a vehicle (e.g., airplane, drone, train, automobile, or other conveyance), Internet of Things (IoT) devices, or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components, such as memory devices 130, when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory components such as 3D cross-point type and NAND type memory are described, the memory device 130 can be based on any other type of non-volatile memory, such as read-only memory (ROM), phase change memory (PCM), magneto random access memory (MRAM), negative-or (NOR) flash memory, electrically erasable programmable read-only memory (EEPROM), and a cross-point array of non-volatile memory cells.

One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages or codewords that can refer to a logical unit of the memory device used to store data. With some types of memory (e.g., NAND), pages can be grouped to form blocks. Some types of memory, such as 3D cross-point, can group pages across dice and channels to form management units (MUs).

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a read and write voltage managing component 113 that can adjust a read voltage (i.e., a demarcation voltage) and a write voltage (i.e., a reset voltage for setting a state of a memory cell to a reset state) by using test voltages determined based on a space between threshold voltage distributions. In some embodiments, the memory sub-system controller 115 includes at least a portion of the read and write voltage managing component 113. For example, the memory sub-system controller 115 can include a processor 117 (processing device) configured to execute instructions stored in local memory 119 for performing the operations described herein. In some embodiments, the read and write voltage managing component 113 is part of the host system 110, an application, or an operating system.

The read and write voltage managing component 113 can determine test demarcation voltages based on a current demarcation voltage and a space between two threshold voltage distributions each corresponding to a different state of the memory cell. For each test demarcation voltage, the read and write voltage managing component 113 can determine an error rate of reading the state of the memory cell based on a respective test demarcation voltage. The read and write voltage managing component 113 can further determine a test demarcation voltage having the lowest error rate. Then, the read and write voltage managing component 113 can set the current demarcation voltage to correspond to the test demarcation voltage having the lowest error rate.

In some other implementations, the read and write voltage managing component 113 can count a number of write or read operations performed on a memory cell. Responsive to determining that the number of operations correspond to a threshold count, the read and write voltage managing component 113 can determine at least one test reset voltage based on a current reset voltage. Then, the read and write voltage managing component 113, for each test reset voltage, can determine an error rate associated with the respective test reset voltage. The read and write voltage managing component 113 can set the current reset voltage to correspond to a test voltage having an error rate that satisfies a threshold condition specifying a maximum error rate. Further details with regards to the operations of the read and write voltage managing component 113 are described below.

Figure 2A:
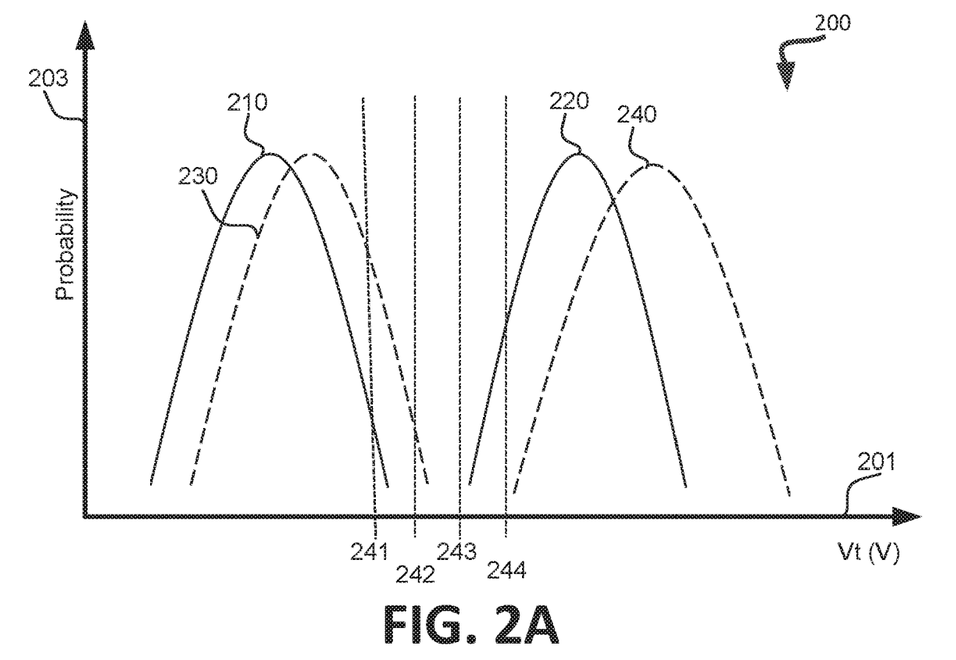
FIG. 2A is a graph illustrating threshold voltage distributions under two different operation conditions in accordance with some embodiments of the present disclosure.

FIG. 2A is a graph 200 illustrating threshold voltage distributions under two different operation conditions in accordance with some embodiments of the present disclosure. Different demarcation voltages can be tested to determine a demarcation voltage having the lowest error rate as will be described below.

The graph 200 depicts two axes, a horizontal axis 201 and a vertical axis 203. The horizontal axis 201 indicates a threshold voltage. The vertical axis 203 indicates a probability of reading a memory cell or a number of bit counts for the memory cell having a threshold voltage within a range of threshold voltages or a normal distribution of threshold voltages.

The two distributions 210 and 220 are threshold voltage distributions (e.g., a normal distribution) that represent a probability of reading a memory cell(s) after a short write to read delay (e.g., 25 microseconds (µs)). A write to read delay refers to a period of time between performances of a write operation and a subsequent read operation on a memory cell. The first distribution 210 represents the probability of reading a memory cell(s) written to logic '1' or a set state at threshold voltages within a range (e.g., normal distribution of threshold voltages). The second distribution 220 represents the probability of reading a memory cell(s) programmed to logic '0' or a reset state at any threshold voltage in the range.

The two other distributions 230 and 240 are threshold voltage distributions that represent a probability of reading a memory cell(s) after a long write to read delay (e.g., a second). The third distribution 230 represents the probability of reading a memory cell(s) written to logic '1' or a set state at threshold voltages within a range (e.g., normal distribution of threshold voltages). The fourth distribution 240 represents the probability of reading a memory cell(s) programmed to logic '0' or a reset state at any threshold voltage in the range.

As illustrated, the threshold voltage distributions shift depending on the length of the write to read delay. Accordingly, a range of demarcation voltages can be tested on the four distributions in order to cover margins of set and reset states. Moreover, a space between a pair of threshold voltage distributions (e.g., distributions 210 and 220 and distributions 230 and 240) for the set and reset states can decrease or degrade over time as the memory cell wears out. The space is sometimes also called as a read window or a threshold voltage window. The amount of the space can depend on a number of write or read counts (i.e., a number of write or read operations performed on the memory cell), a temperature, write to write delay (i.e., a time period between performances of consecutive write operations on the memory cell), and etc. Further details of a wearing effect of a memory cell will be described with respect to FIG. 3.

The graph also depicts four test demarcation voltages 241, 242, 243, and 244. A demarcation voltage is a voltage applied to a memory cell for reading a corresponding state (e.g., a set or reset state). For example, a memory cell having a threshold voltage below the demarcation voltage is considered to store logic '1' or to be in the set state. On the other hand, a memory cell having a threshold voltage above the demarcation voltage is considered to store logic '0' or to be in the reset state. Because the threshold voltage distributions shift, a demarcation voltage needs to be updated for accurate reading of data stored on the memory cell. Accordingly, a processing device (e.g., the read and write voltage managing component 113) can update the demarcation voltage for every threshold read or write count. For example, at 50,000 write count, the read and write voltage managing component 113 can determine a plurality of test demarcation voltages (e.g., voltages 241, 242, 243, and 244) based on the current demarcation voltage.

In determining the test demarcation voltages (e.g., voltages 241, 242, 243, and 244), the read and write voltage managing component 113 can determine the current demarcation voltage. The read and write voltage managing component 113 can also determine an amount of variations in the threshold voltage window. In one implementation, the read and write voltage managing component 113 can use a pre-generated look-up table. The look-up table can include a threshold voltage window between threshold voltage distributions measured under various operation conditions such as a write or read operation count, temperature, and write to write delay time. The threshold voltage window can be determined in terms of a voltage. For example, the read and write voltage managing component 113 can determine two threshold voltage windows measured at 50,000 write count and having the lowest and highest value. Then, the read and write voltage managing component 113 can determine a difference (e.g., 75 mV) between the two threshold voltage windows for the amount of variations in the threshold voltage window. In another implementation, the read and write voltage managing component 113 can monitor the threshold voltage window over a period of time under various operation conditions (e.g., a write or read operation count, temperature, and write to write delay time) and generate a record of the measured threshold voltage windows. The read and write voltage managing component 113 can then use the recorded data to calculate the difference between the two threshold voltage windows (i.e., having the highest and lowest value) for the amount of variations in the threshold voltage window.

Once the read and write voltage managing component 113 has determined the current demarcation voltage and the amount of variations in the threshold voltage window at the given write count (or the given number of write operations), the read and write voltage managing component 113 can determine a plurality of test demarcation voltages covering both the current demarcation voltage and the amount of variations in the threshold voltage window. For example, the read and write voltage managing component 113 can determine to generate four test demarcation voltages (e.g., voltages 241, 242, 243, and 244) given that the current demarcation voltage is 0V and the amount of variations in the threshold voltage window is 75 mV. In such a case, the read and write voltage managing component 113 can determine the test demarcation voltages 241, 242, 243, and 244 to be −25 mV, 0V, 25 mV, and 50 mV, respectively. As such, the test demarcation voltages 241, 242, 243, and 244 span over the 75 mV range. Also, the test demarcation voltages 241, 242, 243, and 244 include the current demarcation voltage (i.e., test demarcation voltage 242). In another implementation, the test demarcation voltages need not include the current demarcation voltage, but instead cover the range that includes the current demarcation voltage.

Figure 2B:
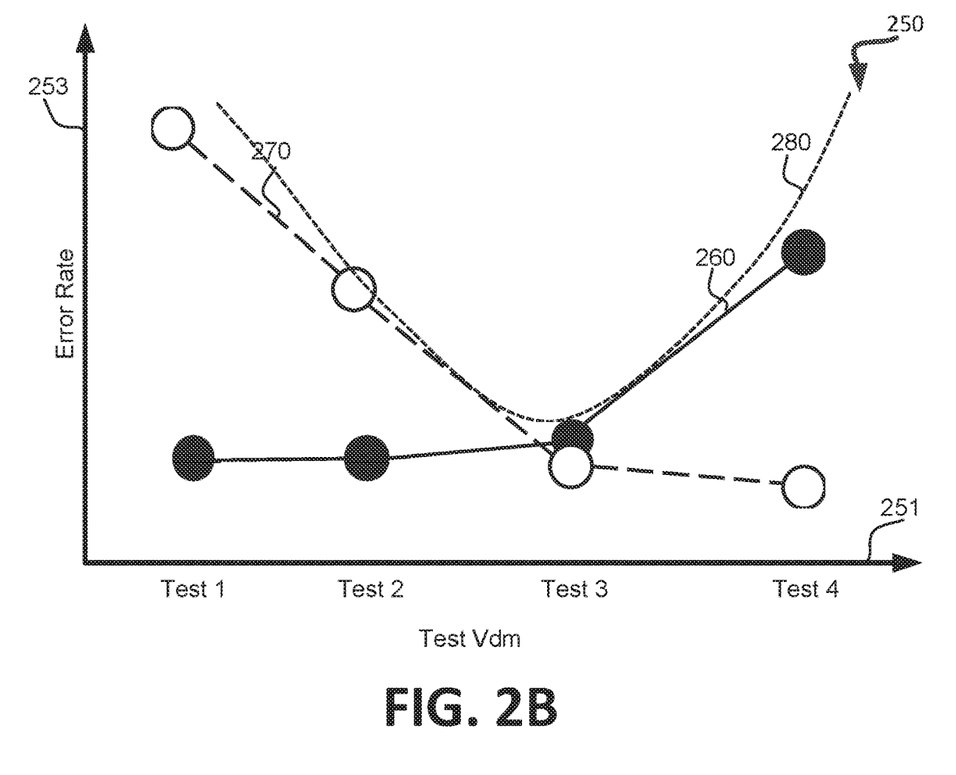
FIG. 2B is a graph illustrating an error rate associated with different test demarcation voltages in accordance with some embodiments of the present disclosure.

FIG. 2B is a graph 250 illustrating an error rate associated with different test demarcation voltages in accordance with some embodiments of the present disclosure.

The graph 250 includes two axes, a horizontal axis 251 and a vertical axis 253. The horizontal axis 251 indicates a plurality of test demarcation voltages. Test 1 to 4 can correspond to the test demarcation voltages 241, 242, 243, and 244 of FIG. 2A, respectively. The vertical axis 253 indicates an error rate of reading a state of a memory cell. The error rate can correspond to a rate of success or failure in reading the state of the memory cell using a (test)

demarcation voltage. In one implementation, the error rate can be a raw bit error rate (RBER). The RBER can be defined as the ratio of the number of erroneous bits to the number of all data bits stored in memory cells of a data block.

In order to take account of the shift in threshold voltage distributions due to the length of a write to read delay, a processing device (e.g., the read and write voltage managing component 113) can determine two separate error rates for each test demarcation voltage—one error rate when a memory cell is having a short (e.g., 25 µs) write to read delay and the other error rate for a long write to read delay (e.g., a second). The read and write voltage managing component 113 can determine an error rate by applying a corresponding test demarcation voltage (e.g., −25 mV) in reading the state of the cell for a plurality number of times and by determining a rate of success or failure in reading the correct state. Accordingly, a line 260 represents error rates for each test demarcation voltage for a memory cell having a short write to read delay (e.g., 25 µs). A line 270 represents error rates for each test demarcation voltage for a memory cell having a long write to read delay (e.g., a second). Based on the two lines 260 and 270, the read and write voltage managing component 113 can select a test demarcation voltage having the lowest error rate in overall when both situations (i.e., the short and long write to read delay) are considered.

For example, the read and write voltage managing component 113 can add two error rates (one error rate when a memory cell is having a short (e.g., 25 µs) write to read delay and the other error rate for a long write to read delay (e.g., a second)) for each test demarcation voltage. Then, the read and write voltage managing component 113 can determine a test demarcation voltage having the lowest total error rate. As illustrated, the Test 3 (e.g., 25 mV) has the lowest overall error rate. Thus, the read and write voltage managing component 113 can set the current demarcation voltage to be the test demarcation voltage 3. By incorporating the amount of variations in the threshold voltage window when determining test voltages and also incorporating various write to read delays in determining error rates, the read and write voltage managing component 113 can determine an appropriate demarcation voltage that reflects more accurate assessment of the threshold voltage distribution shift.

In another implementation, the read and write voltage managing component 113 can determine a quadratic relationship (e.g., a curve 280) between the two sets of error rates expressed by the lines 260 and 270. To select a test demarcation voltage having the lowest error rate, the read and write voltage managing component 113 can determine a test demarcation voltage (i.e., Test 3) having error rates at the lowest point of the curve 280.

Figure 3:
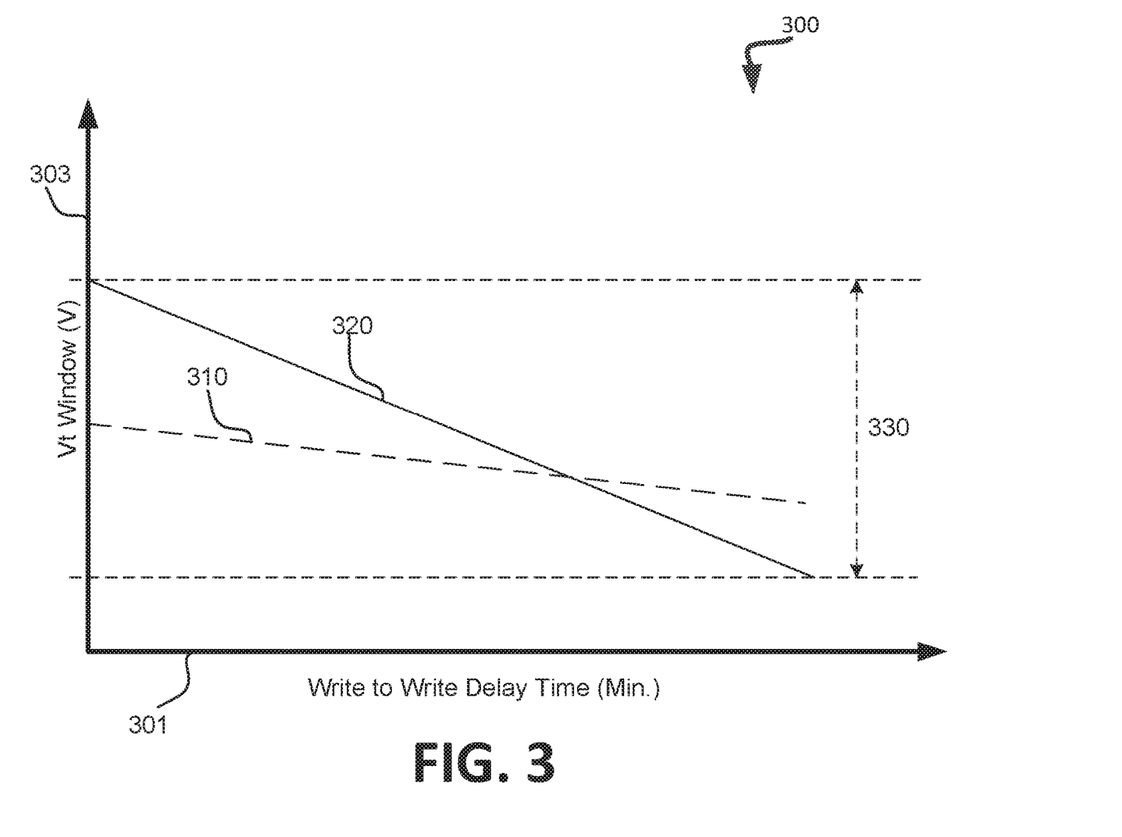
FIG. 3 is a graph illustrating a threshold voltage window determined under various operation conditions in accordance with some embodiments of the present disclosure.

FIG. 3 is a graph 300 illustrating a threshold voltage window determined under various operation conditions in accordance with some embodiments of the present disclosure.

The graph 300 includes two axes, a horizontal axis 301 and a vertical axis 303. The horizontal axis 301 indicates a write to write delay time of a memory cell. A write to write delay time can correspond to a period of time between performances of two consecutive write operations on a memory cell(s). The vertical axis 303 indicates a threshold voltage (Vt) window. A threshold voltage window is sometimes called as a read window or a space between threshold voltage distributions. The threshold voltage window can be determined as a width (of the space) between two threshold voltage distributions at a given probability. The probability can be specified by an error correction code capability and/or failure rate requirements. As a number of write or read counts increases (i.e., a number of write or read operations performed on a memory cell increases), the threshold voltage window tends to be smaller (or more degraded). It may have been assumed that the degradation is due to a number of write or read counts only. However, as shown in the graph 300, the degradation of the threshold voltage window can be affected by various factors, such as a temperature and a write to write delay time.

A line 310 indicates a relationship between the threshold voltage window and the write to write delay time for a memory cell at a low temperature (e.g., 50 F). As illustrated, the longer the write to write delay time, the worse or smaller the threshold voltage window becomes. A line 320 similarly indicates a relationship between the threshold voltage window and the write to write delay time, but for a memory cell at a high temperature (e.g., 70 F). Even at the high temperature, the threshold voltage window becomes worse as the write to write delay time gets longer. However, the line 320 has a higher slope than the line 310. Accordingly, a memory cell at a higher temperature would experience worse degradation of the threshold voltage window.

An arrow 330 represents an amount of variations in the threshold voltage window under different operation conditions (e.g., a temperature, a write to write delay time, etc.). The arrow 330 refers to a difference between the largest and smallest threshold voltage window. As such, the arrow 330 can represent how much threshold voltage distributions can shift. Therefore, the magnitude of the shift is considered in updating a demarcation voltage. In this example, the arrow 330 indicates how much the threshold voltage window has changed for a memory cell at the high temperature. In another implementation, the magnitude of the shift can also be considered in updating a reset voltage.

Although not illustrated in the graph 300, a threshold voltage window can also be affected by process variations in manufacturing memory cells or dies. Because certain memory cells can be especially susceptible to damages, the threshold voltage windows can degrade at a faster rate.

Figure 4:
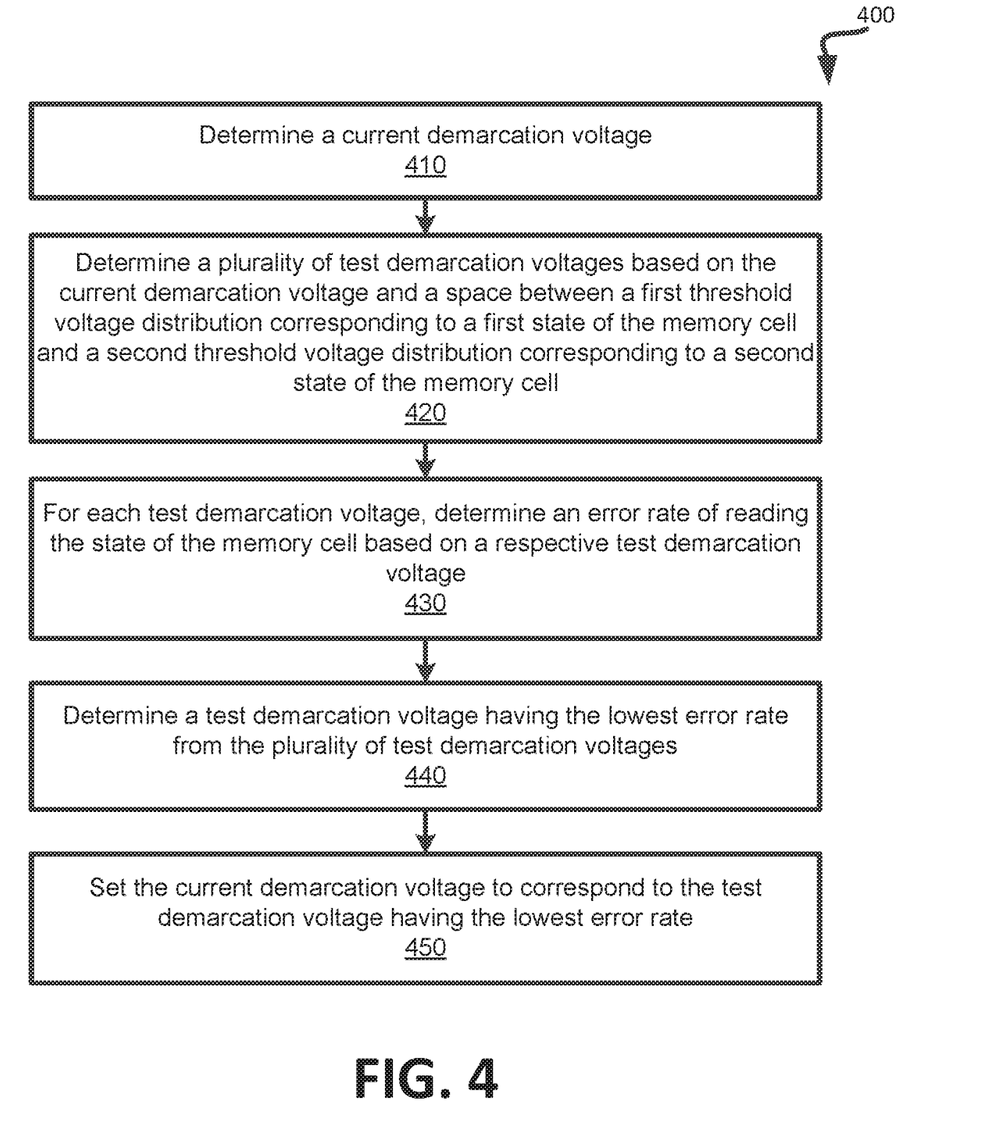
FIG. 4 a flow diagram of an example method to set a demarcation voltage in accordance with some embodiments of the present disclosure.

FIG. 4 is a flow diagram 400 of an example method to set a demarcation voltage in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof In some embodiments, the method 400 is performed by the read and write voltage managing component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing device determines a current demarcation voltage that is to be applied to a memory cell for reading a state of the memory cell. A demarcation voltage can be set by the processing device. The demarcation voltage can sometimes be referred to as a read voltage.

At operation 420, the processing device determines a plurality of test demarcation voltages based on the current demarcation voltage and a space between a first threshold voltage distribution corresponding to a first state of the memory cell and a second threshold voltage distribution corresponding to a second state of the memory cell. The space between the first threshold voltage distributions can sometimes be called a threshold voltage window or a read window. The space between the first threshold voltage distributions are described in details above with respect to FIG. 3.

In one implementation, the processing device can determine a plurality of spaces (at a given probability) between the first threshold voltage distribution and the second threshold voltage distribution of the memory cell under various operation conditions. Each determined space can correspond to the space between the threshold voltage distributions for the memory cell under different operation conditions. A space between threshold voltage distributions can change over time. Usually, the space becomes smaller (i.e., the threshold voltage distributions shifts closer to each other) as the memory cell wears out after a number of write and read operations performed on the memory cell.

In addition to the number of write and read operations, the space can be affected by some operation conditions of the memory cell. Even at the same number of write and read operations, the space can vary depending on operation conditions such as a temperature of an operation environment (which can be affected by a temperature of a server room where the memory sub-system is operating or an amount of heat generated by the host system), a write to write delay time (i.e., a time period representing a time difference between in performing two consecutive write operations on the memory cell), and a process variation in manufacturing the memory cell (e.g., because of some variations in the manufacturing process, some memory cells or their dies are more easily damaged).

For example, a wearing condition (i.e., the space between threshold voltage distributions) of a memory cell at a 200,000 write count (i.e., 200,000 write operations performed on the memory cell) at a high temperature (e.g., 70 F) tends to be worse (i.e., the space between threshold voltage distributions tend to be smaller) with a longer write to write delay time. As another example, for the same memory cell at the 200,000 write count at a low temperature (e.g., 50 F), the space between threshold voltage distributions tends to be smaller but at a slower rate when compared to the memory cell at the high temperature. Yet as another example, a wearing condition of the same memory cell at the 200,000 write count exposed to a short write to write delay time (e.g., a minute) can be worse at the low temperature than the high temperature. However, given a long write to write delay time (e.g., 20 hours), the wearing condition can be worse at the high temperature than the low temperature.

The processing device can determine a space between threshold voltage distributions for the memory cell under various operation conditions using a pre-generated look-up table. The look-up table can include a space measured between threshold voltage distributions under various operation conditions such as a write or read count, temperature, and write to write delay time. The space can be measured in terms of a voltage. For example, the processing device can determine a space for the memory cell at a 20,000 write count in an operation environment at 70 F with a minute write to write delay time to be 100 mV. In another example, the processing device can determine, with the same number of write count, a space for the memory cell at the same temperature with an hour write to write delay time to be 25 mV. The look-up table can be programmed during manufacture of the memory sub-system and stored in the local memory of the memory sub-system controller or any other memory accessible by the processing device. In other examples, the processing device can monitor a change or variations in the space between threshold voltage distributions over a period of time under different operation conditions as described above. While monitoring, the processing device can measure the space between threshold voltage distributions using a mathematical model.

After determining the plurality of spaces, the processing device can determine the plurality of test demarcation voltages spanning a voltage range that corresponds to a difference in the plurality of spaces and that includes the current demarcation voltage. In one implementation, the processing device can determine the difference in the plurality of spaces based on the largest and smallest space from the plurality of spaces. Thus, the difference in the spaces can correspond to a difference between the largest and smallest space between threshold voltage distributions. As such, the difference in the space can represent an amount of variations in the space based on the assumption that the memory cell can be under various operation conditions. The processing device can determine a voltage range based on the current demarcation voltage and the difference in the space. The processing device can select a voltage range that covers the current demarcation voltage but has a width corresponding to the difference in the space. For example, the processing device can determine the largest space between threshold voltage distributions as 100 mV and the smallest as 25 mV. Accordingly, the processing device can calculate the difference as 75 mV. The processing device can also determine that the current demarcation voltage is set to be 0V as a default. Then, the processing device can determine the voltage range to be from −50 mV to 25 mV. In another example, the processing device can select a voltage range having the current demarcation voltage in the middle of the range.

The processing device can determine the number of test demarcation voltages. The processing device can set the number of test demarcation voltages to be at least two. The processing device can identify the test demarcation voltages based on the voltage range and the number of test demarcation voltages. The processing device can determine test demarcation voltages that are evenly distributed over the voltage range. For example, for the voltage range of −50 mV to 25 mV, the processing device can determine that four test demarcation voltages need to be selected. In such a case, the processing device can determine test demarcation voltages to be −50 mV, −25 mV, 0V, and 25 mV. In one implementation, the processing device can include the current demarcation voltage as one of the test demarcation voltages.

At operation 430, the processing device determines, for each test demarcation voltage, an error rate of reading the state of the memory cell based on a respective test demarcation voltage. In one implementation, the processing device can determine an error rate of reading the state of the memory cell by determining a rate of success or failure in reading the state of the memory cell using a (test) demarcation voltage. For example, the processing device can determine a raw bit error rate (RBER) based on each test demarcation voltage. The RBER can be defined as the ratio of the number of erroneous bits to the number of all data bits stored in memory cells of a data block. Accordingly, the processing device can attempt to read stored bits using the respective test demarcation voltage.

When determining the error rate for each test demarcation voltage, the processing device can determine the error rate at different write to read delay times. A write to read delay time corresponds to a period of time between performances of a write operation and a subsequent read operation on a memory cell. For example, the processing device can determine the error rate when the write to read delay time is 25 microsecond (µs) and a second. That is, after 25 µs has passed since a write operation has been performed to set the state of the memory cell, the processing device can determine a first rate of error in reading the state of the memory cell for a plurality of number of times using a respective test demarcation voltage. After a second has passed since the write operation has been performed to set the state of the memory cell, the processing device can determine another rate of error in reading the state of the memory cell for the plurality of number of times using the same test demarcation voltage. Then, the processing device can determine the overall error rate of reading the state of the memory cell for each test demarcation voltage based on the two rate of errors. In one implementation, the processing device can add the two rate of errors for the overall error rate.

At operation 440, the processing device determines a test demarcation voltage having the lowest error rate from the plurality of test demarcation voltages. In one implementation, the processing device can select the test demarcation voltage having the lowest overall error rate. At operation 450, the processing device sets the current demarcation voltage to correspond to the test demarcation voltage having the lowest error rate.

In further embodiments, the processing device can reset the demarcation voltage as in operations 410 to 450, for every threshold read or write count (a number of read operations or write operations performed on the memory cell). In one implementation, the processing device can count a number of write operations (or read operations) performed on the memory cell. The processing device can determine whether the number of write operations performed on the memory cell satisfies a threshold condition, such as a condition that specifies the write count to reach 50,000, 100,000, 150,000, or 200,000. Responsive to determining that the number of write operations performed on the memory cell satisfies the threshold condition, the processing device can perform a series of operations, such as operations 410 to 450

Figure 5A:
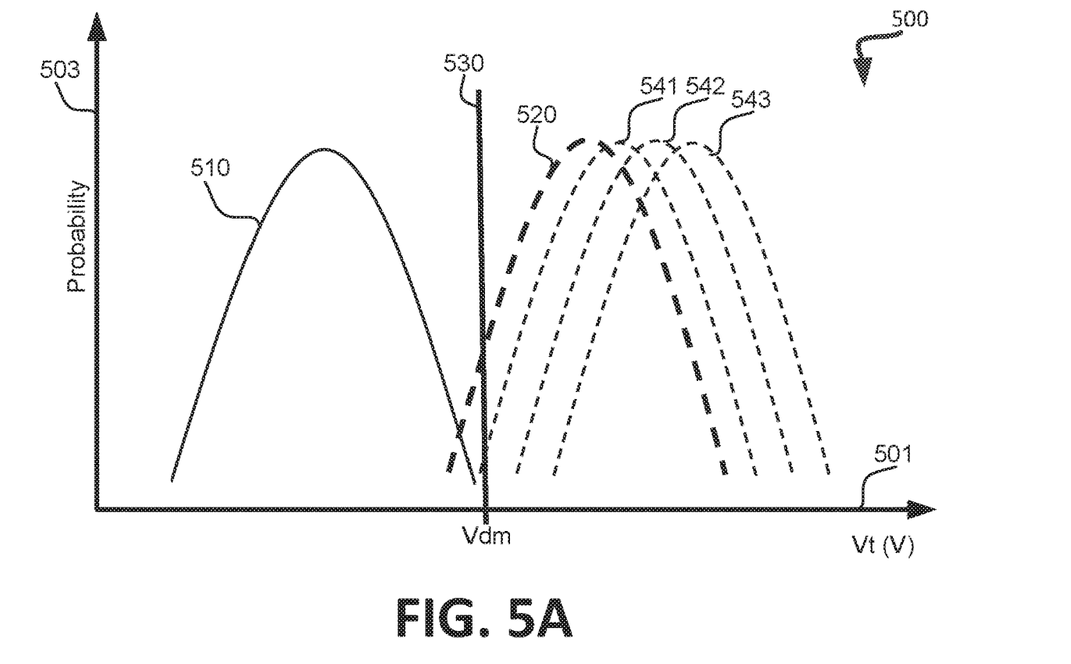
FIG. 5A is a graph illustrating threshold voltage distributions under various operation conditions in accordance with some embodiments of the present disclosure.

FIG. 5A is a graph 500 illustrating threshold voltage distributions under various operation conditions in accordance with some embodiments of the present disclosure. Various reset voltages can be tested to determine a reset voltage having the highest error rate closest to a threshold error rate as will be described below.

The graph 500 depicts two axes, a horizontal axis 501 and a vertical axis 503. The horizontal axis 501 indicates a threshold voltage. The vertical axis 503 indicates a probability of reading a memory cell or a number of bit counts for the memory cell having a threshold voltage within a range of threshold voltages or a normal distribution of threshold voltages.

The first distribution 510 represents the probability of reading a memory cell written to logic '1' or a set state at threshold voltages within a range (e.g., normal distribution of threshold voltages). The second distribution 520 represents the probability of reading a memory cell programmed to logic '0' or a reset state at any threshold voltage in the range.

The graph 500 also depicts three other threshold voltage distributions 541, 542, and 543 for the reset state. Applying different reset voltage to store data at the reset state can result in different threshold voltage distributions 541, 542, and 543. In one implementation, a reset voltage corresponds to a bit line voltage (as opposed to a word line voltage) applied to a memory cell for setting the state to the reset state. The greater the reset voltage is the greater a space between the two distributions (the first distribution 510 and the respective one of distributions 541, 542 and 543) becomes. The space between two threshold voltage distributions (the first distribution 510 and one of distributions 541, 542 and 543) are called a read window or a threshold voltage window. If the threshold voltage window becomes too small, the state of the memory cell may not be ascertainable. On the other hand, if the threshold voltage window becomes too large, the memory cell may not operate properly because too much voltage is supplied.

Accordingly, a processing device, such as the read and write voltage managing component 113 can determine a plurality of test reset voltages having a small interval (e.g., less than 50 mV) between the test reset voltages. In one implementation, the read and write voltage managing component 113 can determine the test reset voltages based on an amount of variations in the threshold voltage window. Additionally or alternatively, the read and write voltage managing component 113 can determine the test reset voltages resulting in a threshold voltage distribution that would not cause improper operation of the memory cell. In further implementations, the read and write voltage managing component 113 can determine the plurality of test reset voltages after setting or updating a demarcation voltage 530 as described with respect to FIGS. 2A and 4.

Figure 5B:
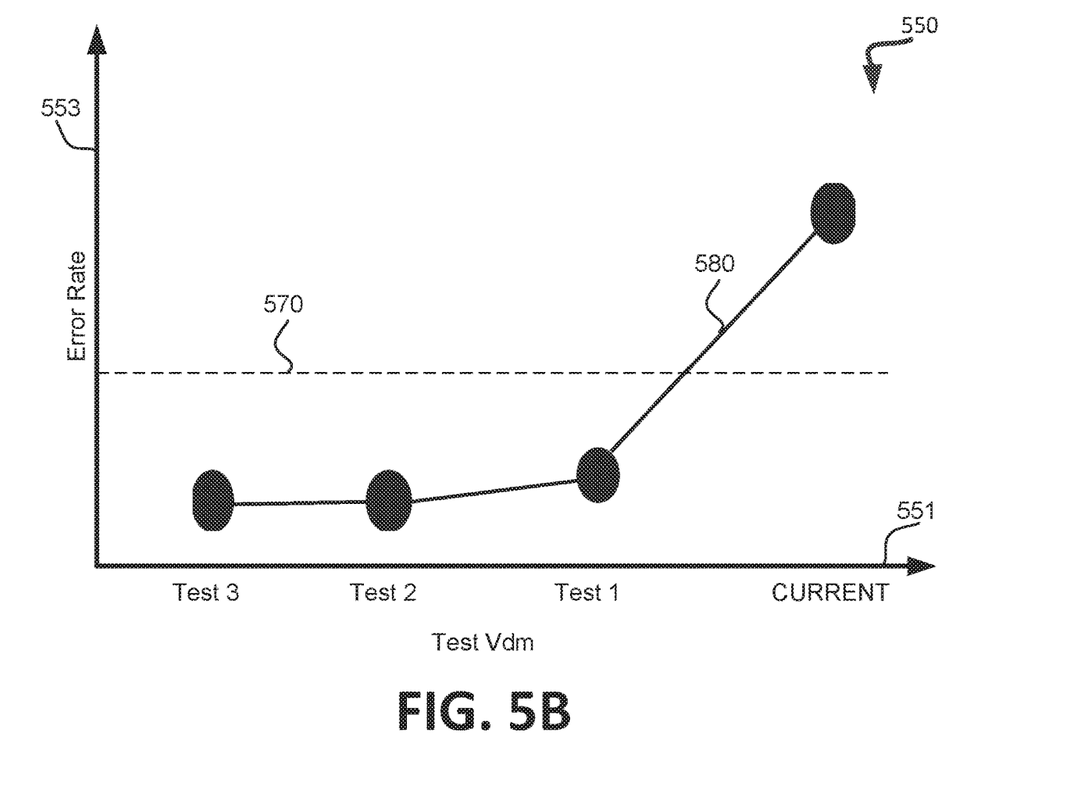
FIG. 5B is a graph illustrating an error rate associated with different test reset voltages in accordance with some embodiments of the present disclosure.

FIG. 5B is a graph 550 illustrating an error rate associated with different test reset voltages in accordance with some embodiments of the present disclosure.

The graph 550 includes two axes, a horizontal axis 551 and a vertical axis 553. The horizontal axis 551 indicates a plurality of test reset voltages and a current reset voltage. Test 1 to 3 can correspond to the test reset voltages causing threshold voltage distribution of 541, 542, and 543 of FIG. 5A, respectively. As such, the reset voltage is greater from Test 1 to 3. The vertical axis 253 indicates an error rate of reading a state of a memory cell. The error rate can correspond to a rate of success or failure in reading the state of the memory cell using a (test) demarcation voltage. In one implementation, the error rate can be a raw bit error rate (RBER). The RBER can be defined as the ratio of the number of erroneous bits to the number of all data bits stored in memory cells of a data block.

A line 580 represents error rates for each test reset voltage, as well as an error rate for current reset voltage. As illustrated, the greater the test reset voltage is the smaller the error rate. A line 570 indicates a threshold error rate that is required for a reliable reading of data programmed in a memory cell. That is, the threshold error rate corresponds to the maximum error rate that can guarantee minimum reliability of the memory cell storing data.

In cases where there are multiple test reset voltages having an error rate below the threshold error rate, a processing device, such as the read and write voltage managing component 113 can select any of the test reset voltage for setting the current reset voltage. In another implementation, the read and write voltage managing component 113 can select a test reset voltage having a corresponding error rate that is closest to the threshold error rate. In this way, the read and write voltage managing component 113 can avoid damaging the memory cell.

Figure 6:
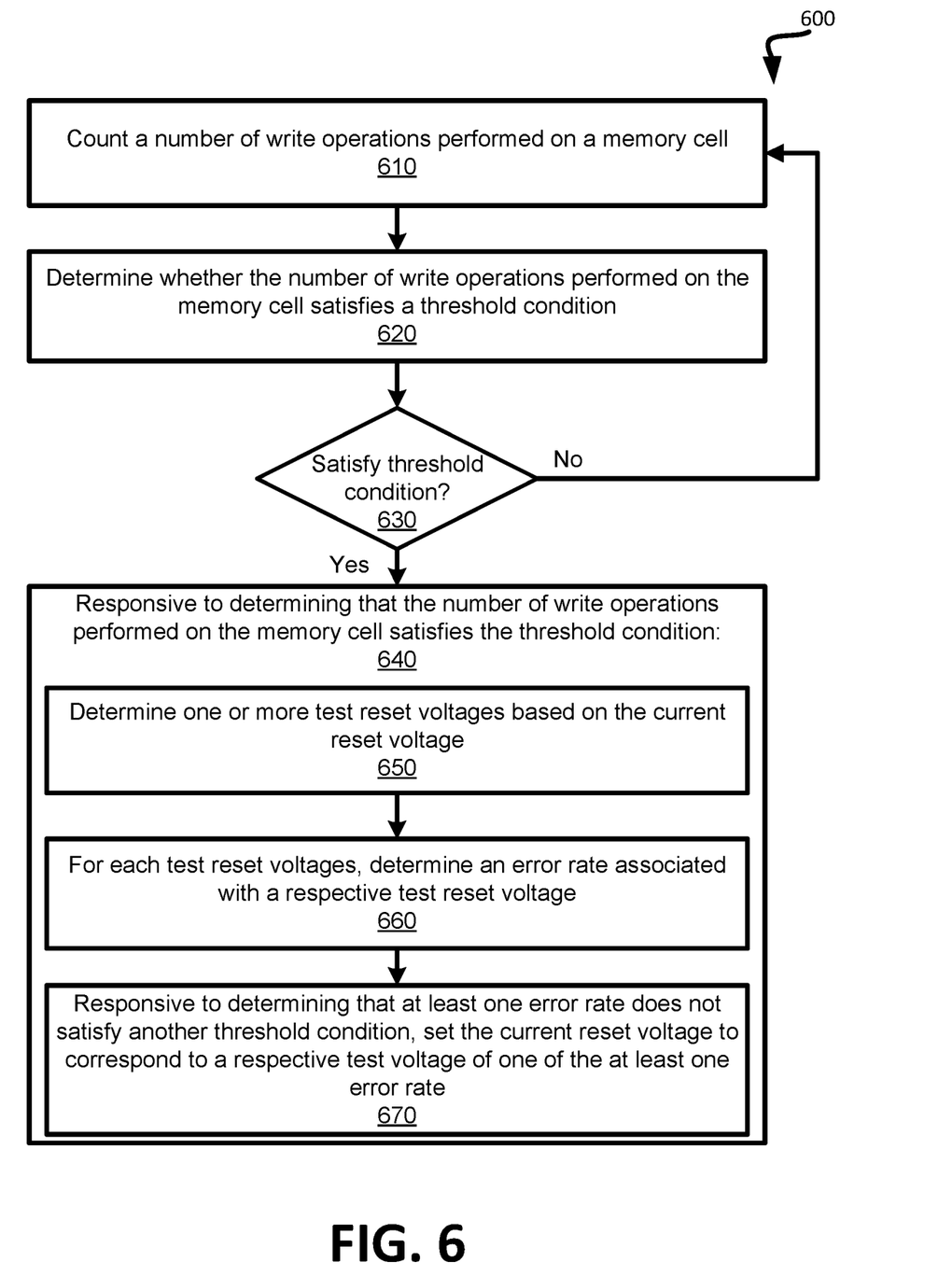
FIG. 6 a flow diagram of an example method to set a reset voltage in accordance with some embodiments of the present disclosure.

FIG. 6 a flow diagram of an example method 600 to set a reset voltage in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the read and write voltage managing component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing device counts a number of write operations performed on a memory cell. In another implementation, the processing device can count a number of read operations performed on a memory cell.

At operation 620, the processing device determines whether the number of write operations performed on the memory cell satisfies a threshold condition. In one implementation, the threshold condition can be associated with a number of write operations or write counts on the memory cell. The threshold condition can specify that the number of write operations to correspond to one of a set of numbers (e.g., 150,000, 200,000, 250,000, or 300,000). In another implementation, the threshold condition can be associated with a number of read operations or read counts on the memory cell.

At operation 630, the processing device, responsive to determining that the number of write operations performed on the memory cell satisfies the threshold condition, the processing device can perform operations 640 to 670. For example, the processing device can determine that the threshold condition is satisfied, when the number of write operations is one of 150,000, 200,000, 250,000, and 300,000.

At operation 640, the processing device determines a current reset voltage that is to be applied to the memory cell for changing a state of the memory cell from a set state to a reset state. In one implementation, a reset voltage can be a write voltage used to write a particular bit value (e.g., 0) to the memory cell. Specifically, the reset voltage can correspond to a bit line voltage (as opposed to a word line voltage) for setting the state to the reset state.

At operation 650, the processing device determines one or more test reset voltages based on the current reset voltage. In one implementation, the processing device can calculate a test reset voltage by adding a multiple of a threshold amount (e.g., 12.5 mV) to the current test reset voltage. For example, if the current reset voltage is 50 mV, the test reset voltages can be 62.5 mV, 75 mV, 87.5 mV, and 100 mV. As such, each test reset voltages would be different from each other. In another implementation, the threshold amount or an interval between test reset voltages can be determined based on an amount of variations in the threshold voltage window (as described in details with respect to FIG. 3). For example, the processing device can divide the amount of variations in the threshold voltage window (e.g., 75 mV) by a number of test rest voltages (e.g., three) to determine the threshold amount (e.g., 25 mV). It should be appreciated that any other techniques can be used to determine test reset voltages based on the current reset voltage.

In further embodiments, the processing device can perform operation 650 under a particular situation. For example, the processing device can determine whether an error rate associated with the current reset voltage satisfies another threshold condition. An error rate can correspond to a rate of success or failure in reading a state of the memory cell that is set to the reset state based on the current reset voltage. For example, the processing device can determine a raw bit error rate (RBER) as the error. The RBER can be defined as the ratio of the number of erroneous bits to the number of all data bits stored in memory cells of a data block. The threshold condition can specify that the error rate be greater than a particular error rate. The particular error rate can be the maximum error rate that can guarantee minimum memory cell reliability. Responsive to determining that the error rate associated with the current reset voltage satisfies the threshold condition (i.e., the error rate associated with the current reset voltage is greater than the particular error rate), the processing device can perform operation 650. Otherwise, the processing device can periodically determine the error rate associated with the current reset voltage until the threshold condition is satisfied.

At operation 660, the processing device determines, for each test reset voltages, an error rate associated with a respective test reset voltage. Similar to the error rate associated with the current reset voltage as described above, the error rate (e.g., RBER) corresponds to a rate of error in reading the state of the memory cell that is set to the reset state by applying the respective test voltage to the memory cell. The processing device can determine an error rate for each test reset voltage by applying the respective test reset voltage in order to set a state of the memory cell to the reset state.

At operation 670, responsive to determining that at least one error rate does not satisfy another threshold condition, the processing device sets the current reset voltage to correspond to a respective test voltage of one of the at least one error rate. The threshold condition can be associated with a threshold error rate. For example, the threshold condition can specify that an error rate be greater than (or, equal to or greater than) the threshold error rate. The threshold error rate can be the maximum error rate that can guarantee minimum reliability of the memory cell storing data. In one implementation, the processing device can determine whether any error rates of the test reset voltages satisfies the threshold condition (i.e., whether or not an error rate exceeds the threshold error rate). If at least one error rate does not exceed the threshold error rate, the processing device can identify a test reset voltage corresponding to the error rate that does not satisfy the threshold condition. In one implementation, the processing device can set the current reset voltage to be any one of the test reset voltages having an error rate that is below the threshold error rate. In case there are multiple test reset voltages having such error rate, the processing device can select the one test reset voltage having a corresponding error rate that is closest to the threshold error rate. The processing device can set the current reset voltage to correspond to such test reset voltage.

In further implementations, the processing device can perform the method 600 after performing the method 400 so that the demarcation voltage is updated to account for any shift in threshold voltage distributions.

Figure 7:
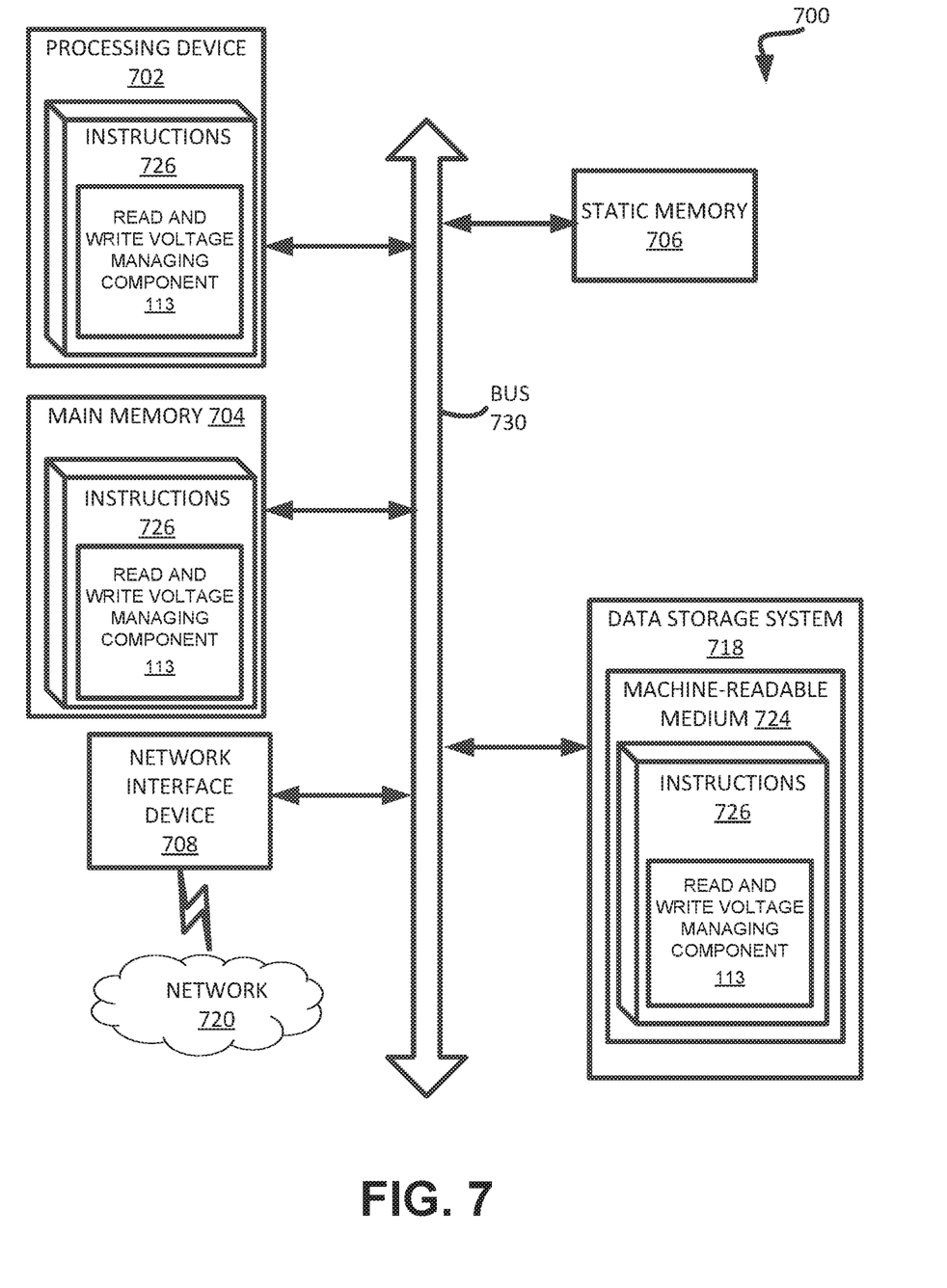
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the read and write voltage managing component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a read and write voltage managing component (e.g., the read and write voltage managing component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory component including one or more memory cells; and
   a processing device, operatively coupled with the memory component, the processing device configured to perform operations comprising:
      determining a current demarcation voltage that is to be applied to a memory cell for reading a state of the memory cell;
      selecting, based on the current demarcation voltage and a space between a first threshold voltage distribution corresponding to a first state of the memory cell and a second threshold voltage distribution corresponding to a second state of the memory cell, a test demarcation voltage having a low error rate of reading the state of the memory cell; and
      setting the current demarcation voltage to correspond to the selected test demarcation voltage.

2. The system of claim 1, wherein the operations further comprise:
   determining a plurality of spaces between the first threshold voltage distribution and the second threshold voltage distribution of the memory cell, each space associated with the memory cell under different operation conditions; and
   determining a plurality of test demarcation voltages spanning a voltage range that corresponds to a difference in the plurality of spaces and that includes the current demarcation voltage, wherein the selected test demarcation voltage is one of the plurality of test demarcation voltages.

3. The system of claim 2, wherein the operation conditions comprise at least one of a plurality of temperatures associated with operation environment of the memory cell, or a plurality of time periods each representing a time difference between in performing two consecutive write operations on the memory cell.

4. The system of claim 2, wherein the operations further comprise:
   for each test demarcation voltage:
      after a first time period has passed since a write operation has been performed to set the state of the memory cell, determining a first rate of error in reading the state of the memory cell for a plurality of number of times using a respective test demarcation voltage;
      after a second time period has passed since the write operation has been performed to set the state of the memory cell, determining a second rate of error in reading the state of the memory cell for the plurality of number of times using the respective test demarcation voltage, wherein the first time period and the second time period are different; and
      determining an error rate of reading the state of the memory cell based on the first rate of error and the second rate of error.

5. The system of claim 4, wherein the determining of the error rate of reading the state of the memory cell based on the first rate of error and the second rate of error comprises:
   determining the error rate of reading the state of the memory cell to correspond to a sum of the first rate of error and the second rate of error.

6. The system of claim 1, wherein the operations further comprise:
   counting a number of write operations performed on the memory cell;
   determining whether the number of write operations performed on the memory cell satisfies a first threshold condition; and
   responsive to determining that the number of write operations performed on the memory cell satisfies the first threshold condition, determining the current demarcation voltage.

7. The system of claim 2, wherein one of the plurality of test demarcation voltages corresponds to the current demarcation voltage.

8. A method comprising:
   determining a current demarcation voltage that is to be applied to a memory cell for reading a state of the memory cell;
   selecting, based on the current demarcation voltage and a space between a first threshold voltage distribution corresponding to a first state of the memory cell and a second threshold voltage distribution corresponding to a second state of the memory cell, a test demarcation voltage having a low error rate of reading the state of the memory cell; and
   setting the current demarcation voltage to correspond to the selected test demarcation voltage.

9. The method of claim 8, further comprising:
   determining a plurality of spaces between the first threshold voltage distribution and the second threshold voltage distribution of the memory cell, each space associated with the memory cell under different operation conditions; and
   determining a plurality of test demarcation voltages spanning a voltage range that corresponds to a difference in the plurality of spaces and that includes the current demarcation voltage, wherein the selected test demarcation voltage is one of the plurality of test demarcation voltages.

10. The method of claim 9, wherein the operation conditions comprise at least one of a plurality of temperatures associated with operation environment of the memory cell, or a plurality of time periods each representing a time difference between in performing two consecutive write operations on the memory cell.

11. The method of claim 9, further comprising:
   for each test demarcation voltage:
      after a first time period has passed since a write operation has been performed to set the state of the memory cell, determining a first rate of error in reading the state of the memory cell for a plurality of number of times using a respective test demarcation voltage;
      after a second time period has passed since the write operation has been performed to set the state of the memory cell, determining a second rate of error in reading the state of the memory cell for the plurality of number of times using the respective test demarcation voltage, wherein the first time period and the second time period are different; and determining an error rate of reading the state of the memory cell based on the first rate of error and the second rate of error.

12. The method of claim 11, wherein the determining of the error rate of reading the state of the memory cell based on the first rate of error and the second rate of error comprises:

determining the error rate of reading the state of the memory cell to correspond to a sum of the first rate of error and the second rate of error.

13. The method of claim 8, further comprising:

counting a number of write operations performed on the memory cell;

determining whether the number of write operations performed on the memory cell satisfies a first threshold condition; and responsive to determining that the number of write operations performed on the memory cell satisfies the first threshold condition, determining the current demarcation voltage.

14. The method of claim 9, wherein one of the plurality of test demarcation voltages corresponds to the current demarcation voltage.

15. A method comprising:

counting a number of write operations performed on a memory cell; and responsive to determining that the number of write operations performed on the memory cell satisfies a first threshold condition:

determining a current reset voltage that is to be applied to the memory cell for changing a state of the memory cell from a set state to a reset state;

determining, based on the current reset voltage, a test reset voltage having an error rate in accordance with a second threshold condition; and setting the current reset voltage to correspond to the determined test reset voltage.

16. The method of claim 15, wherein the first threshold condition specifies that the number of write operations is to correspond to one of a set of numbers.

17. The method of claim 15, wherein the second threshold condition specifies that an error rate is to be greater than a threshold error rate.

18. The method of claim 17, wherein the error rate corresponds to a rate of error in reading the state of the memory cell that is set to the reset state by applying the determined test reset voltage to the memory cell.

19. The method of claim 15, further comprising:

determining one or more test reset voltages by adding a multiple of a threshold amount to the current reset voltage, each test reset voltages being different from each other.

20. The method of claim 17, wherein the setting of the current reset voltage comprises:

determining an error rate being closest to the threshold error rate of the second threshold condition; and setting the current reset voltage to correspond to a respective test voltage of the error rate being closest to the threshold error rate.

* * * * *